US005094880A

United States Patent [19]
Hongoh

[11] Patent Number: 5,094,880
[45] Date of Patent: Mar. 10, 1992

[54] THIN SUPERCONDUCTING FILM AND MANUFACTURING METHOD FOR THE SAME

[75] Inventor: Masashi Hongoh, Atsugi, Japan

[73] Assignee: Semiconductor Energy Laboratory Co., Ltd., Kanagawa, Japan

[21] Appl. No.: 551,172

[22] Filed: Jul. 11, 1990

[30] Foreign Application Priority Data

Jul. 13, 1989 [JP] Japan .................................. 1-181322

[51] Int. Cl.$^5$ .......................... B05D 5/12; B05D 3/06
[52] U.S. Cl. .................................. 427/62; 427/53.1;
427/255.6; 427/54.1; 505/819; 505/816;
204/192.24
[58] Field of Search ...................... 427/53.1, 54.1, 62,
427/63, 255.6; 505/819, 816, 802; 204/192.24,
DIG. 11, 298.09

[56] References Cited

U.S. PATENT DOCUMENTS 4,604,294  8/1986  Tanaka et al. ...................... 427/53.1
4,632,776  12/1986  Williams et al. ...................... 252/518
4,764,003  8/1988  Lake et al. ............................ 350/610

OTHER PUBLICATIONS

Dijkkamp et al., "Preparation of Y-B$_a$-C$_u$ oxide superconductor thin films using pulsed laser evaporation from high Tc bulk material" Appl. Phys. Lett. 51(8) Aug. 1987, pp. 619-621.

Commonwealth Scientific Corporation Catalog 1977.

Fan, "Preparation of Sn-doped In$_2$O$_3$ (ITO) films at low deposition temperature by ion-beam sputtering", Appl. Phys. Lett. 34(8), Apr. 1979, pp. 545-517.

Schweitzer et al., "Superconductivity in polycrystalline pressed samples of organic metals", Solid State Communications, vol. 69, No. 8, pp. 843-845 (1989).

Primary Examiner—Shrive Beck
Assistant Examiner—Roy V. King
Attorney, Agent, or Firm—Sixbey, Friedman, Leedom & Ferguson

[57] ABSTRACT

A superconducting film is formed by a physical vapor deposition. In order to form such a superconducting film as exhibits a sufficient superconductivity a small portion of a target is sublimed without decomposing molecules of the target and deposited on a surface of a substrate. In addition an undesirable component is not introduced from the target into the superconducting film.

9 Claims, 2 Drawing Sheets

THIN SUPERCONDUCTING FILM AND MANUFACTURING METHOD FOR THE SAME

BACKGROUND OF THE INVENTION

1. Field of the Invention

The present invention relates to a superconducting material and, in particular, to an organic superconducting material in the form of a thin film.

2. Description of the Prior Art

Since the discovery in 1979 of an organic material with metallic properties, known as TFT-TCNQ, considerable research has been carried out relating to the electrical conductivity of organic materials. Up to the present, dozens of types of organic superconductors have been developed. Of these, the highest temperature at which superconducting properties have been observed is only about 10 K. However, considerable attention is being paid to the fact that continuing research has been successful in sharply increasing the critical temperature, and to the fact that the key materials are readily synthesized.

This type of organic superconductor is often available in bulk form (aggregates of small crystals), and the electric and electronic industries found difficulty in application of the organic superconductor in bulk form in the electric and electronic fields, and are eagerly awaiting the appearance of these superconductors in the form of thin films.

At the present time, many different forms of thin films have been created experimentally, but up until now superconductors have not been available in these forms.

For example, trials have been run on a method by which organic superconducting materials are vaporized using a heater, then recrystallized on a film-forming surface. Many of the films formed using this method exhibit a structure which differs from that of the crystals of the starting material, or, a molecular composition which differs from that of the crystals of the starting material, so that they cannot be utilized in practice.

This is because an organic superconductor generally has a low sublimation point and a low heat resistance. Specifically, the organic superconductor decomposes immediately on vaporization and the molecular structure is destroyed.

SUMMARY OF THE INVENTION

An object of the present invention is to provide, with due consideration to the drawbacks of such conventional devices, an organic superconducting film and also a method for forming an organic superconducting film.

This object is achieved in the present invention by the provision of an organic superconducting film formed by a physical vapor deposition. This physical vapor deposition is performed by giving a light energy to a target superconductor provided in a container so that the target superconductor is sublimed without decomposing molecules of the target superconductor. In order to avoid this decomposition the target superconductor is radiated with the light so that a small portion of the target superconductor is instantaneously heated. Since an undesirable component including the decomposed superconductor is frequently introduced from the other portion of the target superconductor into a superconducting film formed on a surface of a substrate when increasing a temperature of the other portion, the light is preferably concentrated so that such introduction is avoided. The light energy source is, for example, a laser, a visual light, and an ultraviolet rays and the like. The visual light and the ultraviolet rays are preferably focussed on the substrate by an optical system.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

The present invention will now be explained using a laser as an example of the light energy source.

The sublimation point of a target superconductor comprising organic complex is extremely low in comparison with that of a semiconductor and insulator. Therefore, it may be felt that the target superconductor is not suitable for physical sublimation by using a laser beam. However, because sublimation takes place in an extremely short time so that the molecular structure of the organic complex is not destroyed, and because the film maintains its basic molecular structure of the organic complex when deposited on a substrate, a film with good orientation is obtained.

Because the dimensions of a laser beam can be regulated through an optical system, it is also possible to sublime only the necessary portion of the target, without heating the whole target superconductor.

Figure 1:
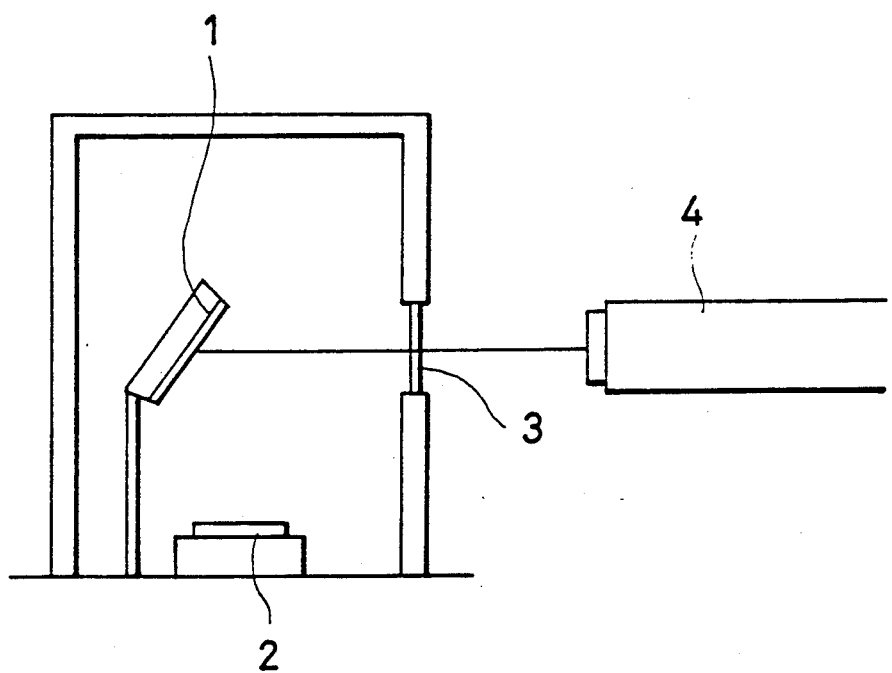
FIG. 1 is a simplified cross sectional view showing the internal structures of a laser sublimation device of the present invention.
Figure 2A:
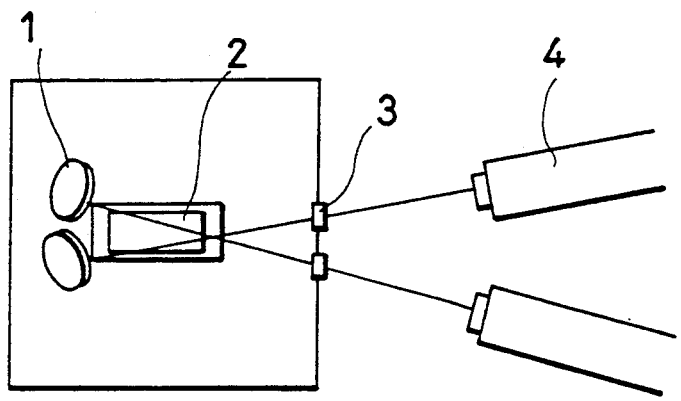
FIG. 2(A) is a simplified plan view with the housing removed to show the internal structure of a laser sublimation device of the present invention.
Figure 2B:
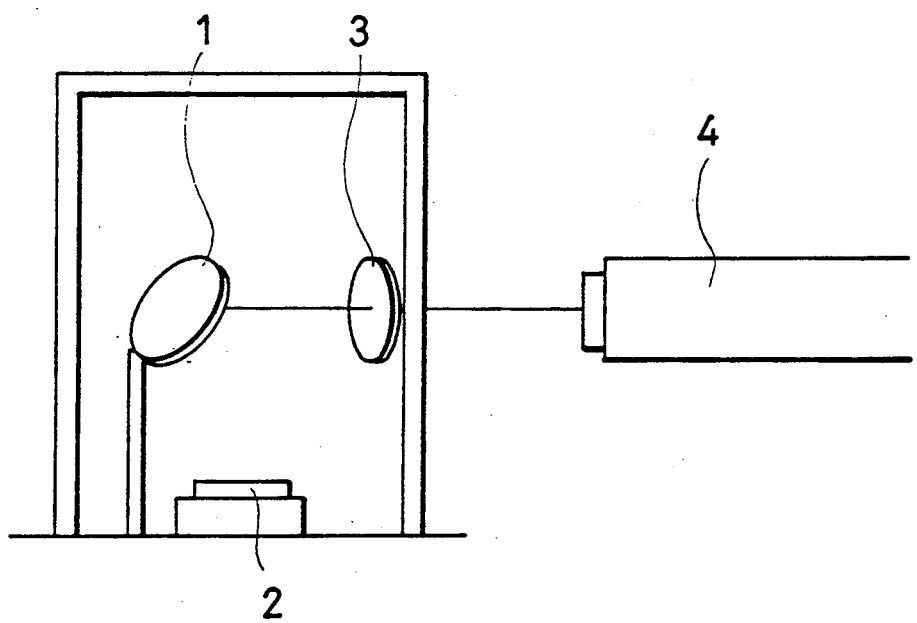
FIG. 2(B) is a simplified cross sectional view of the device of FIG. 2(A).

FIG. 1 and FIG. 2 show the general internal structures of two different sublimation devices. Illustrated in FIG. 1 is a single target 1 of an organic complex, which is the starting material. In FIG. 2(A) and (B) two targets 1 are shown. Also shown in these drawings are a substrate 2 and a laser beam entry window 3. The laser beam is directed onto the target 1 and the sublimed material forms a film on the substrate 2. Essential auxiliary equipments, such as a gas introduction system, an exhaust system, and other units, have been omitted from the drawings.

Lasers operating in the infrared region, such as Nb-YAG or $CO_2$ gas lasers or the like, or excimer lasers operating in the ultraviolet region, such as KrF excimer laser, XeCl excimer laser, or the like may be used in the present invention. Specifically, a laser beam by which only the necessary portion of the target can be instantaneously heated is preferable. In addition, pulsed beams are better than the continuous beams, and pulsed beams obtained from the continuous beams by the use of a shutter, chopper or the like is also better than the continuous beams. This is because the shorter the heating time, the less breakdowns in the molecular structure of the target. The pulse width or the duration of one radiation of the beams is set so that the length of time the target is heated by one radiation of the laser beam is a millisecond or less.

Since only the necessary portion of the target is radiated with a concentrated light including the laser beam, an undesirable component including a decomposed superconductor is not introduced from the target into the organic superconducting film formed on a surface of a substrate.

Since the decomposition of the organic material occurs at a low temperature, it is necessary that during sublimation the laser output be restrained as much as possible. For example, the laser should be used at an energy density of 200 mJ/cm$^2$ or less. The surface temperature of the target of the organic complex at this time is in the range of 100 to 400 degrees Centigrade. The surface temperature of the target is not only controlled by the amount of energy in the laser beam and the duration of the radiation; it is also controlled by a cooling medium used to cool the target from its rear side surface. In the present invention, in order to prevent the organic complex of the target from being decomposed by the heat the film may be formed by the radiation of the light including laser beams in pulse form with the target supercooled by liquid nitrogen or the like, so that only the necessary portion of the target is heated and sublimed. One target, or two or more targets can be used. For example, in the case of an organic complex with a molecular structure (A+B) in which A and B are combined stably, one target is used for sublimation. Conversely, in the case where the molecular state of the structure (A+B) is unstable and A and B become easily separated, one beam can be directed alternately toward the two targets, or two beams can be used for simultaneous sublimation. This is very advantageous in that chain molecules comprising the A structure and B structure are gradually deposited on the substrate to form the organic superconducting film. The A part of the molecular structure of the above organic complex indicates a part with a main structure in which a supercurrent flows, and the B indicates a part positioned on the side surface of the main structure which plays a second role to produce a carrier or the like. An atmosphere of a gas such as Ar, N$_2$, O$_2$, or the like is used as required. When a gas is not used, the process is carried out under a vacuum of $10^{-3}$ to $10^{-7}$ Torr. When a gas atmosphere is used, the process is carried out at 200 to $10^{-1}$ Torr. The substrate is heated to a low temperature. Many different types of materials can be used, but in all cases the temperature range is from just below the decomposition temperature of the organic superconducting material to 100 degrees Centigrade below the decomposition temperature. Heating of the substrate is necessary for a film to be formed by lamination on the substrate. If the temperature is too high, care must be taken to prevent the organic superconducting film from being decomposed after it has been formed. A slow deposition rate is used in order to form a uniform organic superconducting film.

EMBODIMENT NO. 1

A (BEDT-TTF)$_2$I$_3$ thin film was formed in this embodiment of the present invention where the BEDT-TTF is an abbreviation of bis(ethylenedithio)tetrathiafulvalene. The decomposition temperature of BEDT-TTF is 248 degrees Centigrade. The target was therefore cooled so that the temperature would not exceed 250 degrees Centigrade. The laser beam was condensed in an optical system to a diameter of 150 microns.

A device of the configuration shown in FIG. 1 was used. The substrate was Si and was directly heated by a heater. The temperature of the substrate was measured by means of a copper-constantan thermocouple or the like. The temperature during the film-forming process ranged from 110 to 170 degrees Centigrade. This is a rather low temperature range, but was used to prevent the film composition from deviating by loss of iodine during the formation of the thin film. The separation of the substrate and the target was in the 3 cm to 8 cm range, but a rather short separation is preferable. No particular gaseous atmosphere was used, and the film was formed under a vacuum of $10^{-2}$ Torr or less.

The duration of the film-forming process ranged from 1 hour to 2 hours under the above conditions. The finished films ranged from $10^{-8}$ m to $10^{-6}$ m in thickness. The electric resistivity in the direction parallel to the film surface was $10^{-3}$ or more ohm-cm. The electric resistivity at room temperature was $10^4$ to $10^5$ ohm-cm, and the superconductive transition temperature was about 3 K under normal pressure.

EMBODIMENT NO. 2

A (BEDT-TTF)$_2$ReO$_4$ thin film was formed in this embodiment of the present invention. In place of the laser beam of the first embodiment, a KrF (248 microns) excimer laser was used. The pulse rate was 5 to 10 pps(pulse per second). The magnitude of the laser beam was 15 mm by 10 mm, and the energy density was 100 mJ/cm$^2$. Two targets were used; one formed of BEDT-TTF, the other of ReO$_7$; and two types of laser beam systems were provided, such that the laser outputs were determined depending on the decomposition temperature as in the first embodiment, respectively.

The ReO$_7$ target was set rather high in output. The laser and the configuration inside the chamber are shown in FIG. 2 (A) in simplified form. Different targets were radiated with the beams from the two different lasers, so that the sublimed material was deposited on one substrate. FIG. 2 (B) is a side elevational view of the device with one of the two beam routes removed for explanation purpose. The substrate was Si, heated to 150 to 250 degrees Centigrade. Oxygen was required in the formation of this film, and a vacuum of 1 to $10^{-4}$ Torr was maintained in a flow of oxygen. This vacuum was lower than that used in the first embodiment, so the spacing between the target and the substrate was small. An organic superconducting film was produced through this process with a superconductive transition onset temperature of 4 to 5 K under a pressure of about 5 Kbarr.

In the foregoing embodiments, a laser beam was directed onto the target(s) and the organic film was formed on the substrate. However, other possible energy sources are an extra-high pressure mercury lamp, a halogen lamp, or the like, and beams emitted from these lamps are condensed in an optical system to provide the target(s) with a high energy density.

In the case of a molecular structure (A+B) with unstable characteristics, two targets and two energy beams can be used, so that the (A+B) structure is formed on the substrate, as shown in the second embodiment. In addition, it is possible to use one target with half its area covered with the A-structure material and the remainder with the B-structure material, then to direct energy beams onto the two regions simultaneously to form an organic superconducting thin film with an (A+B) structure on the substrate. In this case, by changing the ratio of the time interval during which the energy is directed onto the A region to the time interval during which the energy is directed onto the B region, it is possible to vary the structure of the organic superconducting thin film formed on the substrate.

Based on a method or conditions such as those outlined above, it is possible to obtain a thin film of organic material exhibiting superconductivity in the thin film state which cannot be obtained conventionally.

Since other modification and changes (varied to fit particular operating requirements and environments) will be apparent to those skilled in the art, the invention is not considered limited to the examples chosen for purposes of disclosure, and covers all changes and modifications which do not constitute departures from the true spirit and scope of this invention.

What is claimed is:

1. A method for forming an organic superconducting film comprising the steps of:
    providing a target comprising an organic material for forming an organic superconductor in a container;
    vaporizing said organic material by irradiating a portion of said target with a light; and
    depositing said vaporized material on a surface of a substrate, which is maintained at a temperature less than a decomposition temperature of said target material,
    wherein said target is cooled by a cooling medium so that to prevent the target material from being decomposed.

2. The method for forming a superconducting film of claim 1 wherein said light is a laser beam.

3. The method for forming a superconducting film of claim 1 wherein said light is emitted from a mercury lamp or a halogen lamp.

4. The method for forming a superconducting film of claim 1 wherein said cooling medium is a liquid nitrogen.

5. The method for forming a superconducting film of claim 2 wherein said laser beam is emitted from an excimer laser, $CO_2$ gas laser, or a Nb-YAG laser.

6. The method of claim 1 wherein said portion is heated at 100°–400° C.

7. The method for forming a superconducting film of claim 5 wherein said excimer laser is a KrF excimer laser.

8. The method for forming a superconducting film of claim 5 wherein said excimer laser is a XeCl excimer laser.

9. A method for forming an organic superconductor comprising the steps of:
    placing in a vacuum chamber a target comprising an organic material for forming an organic superconductor;
    vaporizing said organic material by irradiating a portion of said target with a laser beam so that said portion is heated to 100°–400° C.; and
    depositing said vaporized material on a substrate placed in said chamber, wherein said substrate is maintained at a temperature less than a decomposition temperature of said target material,
    wherein said target is cooled by a cooling medium so that to prevent the target material from being decomposed.

* * * * *